United States Patent
Hampl et al.

(10) Patent No.: US 8,845,911 B2
(45) Date of Patent: Sep. 30, 2014

(54) METHOD FOR PRODUCTION OF A MICROSTRUCTURED MOLDED OBJECT

(71) Applicant: Technische Universitaet Ilmenau, Ilmenau (DE)

(72) Inventors: Joerg Hampl, Erfurt (DE); Frank Weise, Ilmenau (DE); Gregor Schlingloff, Ilmenau (DE); Andreas Schober, Erfurt (DE); Uta Fernekorn, Erfurt (DE)

(73) Assignee: Technische Universität Ilmenau (DE)

( * ) Notice: Subject to any disclaimer, the term of this patent is extended or adjusted under 35 U.S.C. 154(b) by 0 days.

(21) Appl. No.: 13/862,023

(22) Filed: Apr. 12, 2013

(65) Prior Publication Data

US 2013/0270225 A1    Oct. 17, 2013

(30) Foreign Application Priority Data

Apr. 12, 2012  (DE) .......................... 10 2012 103 174

(51) Int. Cl.
| | |
|---|---|
| *C03C 15/00* | (2006.01) |
| *B81C 99/00* | (2010.01) |
| *B44C 1/22* | (2006.01) |

(52) U.S. Cl.
CPC ........... *B44C 1/227* (2013.01); *B81B 2207/056* (2013.01); *B81C 99/0085* (2013.01); *B81B 2203/0346* (2013.01); *B81C 2201/034* (2013.01); *B81B 2201/06* (2013.01)
USPC .................. 216/36; 216/33; 216/56; 216/83; 428/132

(58) Field of Classification Search
None
See application file for complete search history.

(56) References Cited

U.S. PATENT DOCUMENTS

| 4,895,749 A | 1/1990 | Rose |
|---|---|---|
| 6,599,612 B1 | 7/2003 | Gray |

(Continued)

FOREIGN PATENT DOCUMENTS

| DE | 37 23 404 | 1/1989 |
|---|---|---|
| DE | 101 34 040 | 2/2003 |
| DE | 10 2004 035 267 | 2/2006 |

(Continued)

OTHER PUBLICATIONS

Hebeiss I. et al.: "Novel three-dimensional Boyden chamber system for studying transendothelial transport" in Lab on a Chip, 2012, 12, pp. 829-834.

*Primary Examiner* — Binh X Tran
*Assistant Examiner* — David Cathey, Jr.
(74) *Attorney, Agent, or Firm* — Mark D. Wieczorek; Mayer & Williams PC

(57) ABSTRACT

A method is provided for producing a microstructured molded object that is intended for culturing of biological cells. According to this method, a plastically deformable first porous film is prepared, as well as a deformable second film and a deformable sacrificial film. The first, second and sacrificial film are placed in a stack. Next, the sacrificial film is subjected to pressure to press the stack into a mold. The mold has recesses, such that deformed regions in the form of cavities are produced in the sacrificial film, the first film and the second film, and undeformed regions remain. During the pressing of the film stack into the mold, the first film and the second film are joined to each other, so that they form a composite film. At least portions of the deformed regions of the second film are etched so that sections of the second film are chemically dissolved. In these sections of the second film, sections in the deformed regions of the first film are opened up, so that the pores in these sections are again free.

9 Claims, 4 Drawing Sheets

(56) References Cited

U.S. PATENT DOCUMENTS

2002/0197622 A1* 12/2002 McDevitt et al. .................. 435/6
2005/0164376 A1* 7/2005 Balagadde et al. ......... 435/289.1
2008/0241502 A1* 10/2008 Giselbrecht et al. ....... 428/313.5
2010/0126965 A1 5/2010 Giselbrecht et al.
2011/0033887 A1* 2/2011 Fang et al. ..................... 435/41

FOREIGN PATENT DOCUMENTS

| DE | 10 2007 023 286 | 11/2008 |
| DE | 10 2007 050 976 | 5/2009 |
| DE | 10 2009 044 113 | 4/2011 |
| DE | 10 2009 044 115 | 4/2011 |
| EP | 0 305 123 | 8/1988 |

* cited by examiner

METHOD FOR PRODUCTION OF A MICROSTRUCTURED MOLDED OBJECT

FIELD OF THE INVENTION

The present invention concerns a method for production of a microstructured molded object, which is especially intended for the culturing of biological cells.

BACKGROUND OF THE INVENTION

DE 10 2004 035 267 B3 reveals a microstructured molded object and a method for its production. The molded object consists of a film, in which at least one hollow structure is introduced. The entire molded object, i.e., both the film and the hollow structures, have a plurality of pores, whose diameter preferably takes on a value between 10 nm and 10 μm. The pores are statistically distributed over the entire molded object. One drawback to this solution is that liquids have to make their way through the molded object across the entire surface, while on the contrary it is advantageous to be able to steer liquids specifically to the cells when culturing biological cells.

DE 10 2009 044 115 A1 shows a microstructured molded object with perforated parts and a method for its production. In this method, a first deformable film with a thickness of less than 1 mm is arranged on top of a second film. The second film has continuous recesses with a diameter of less than 2 mm. The first film is molded into the recesses in the second film, so that cavities arise in the second film. The first film has pores, but the pores are only permeable inside the cavities.

From DE 10 2007 050 976 A1 a method is known for the reshaping of a film in which the film being reshaped is firmly connected to a mold link that has at least one opening. Next, regions of the film being reshaped are subjected to a physical or chemical modification. The so modified film joined to the mold link is inserted into a mold and subjected to a pressure medium which at least partly forms the film into the opening in the mold link.

U.S. Pat. No. 6,599,612 B1 teaches a method for production of a soft, elastic web or film with a continuous pattern of depressions or openings. Such webs are intended as contact surfaces or covering films for absorptive hygiene articles, such as diapers, napkins, wound dressings or the like. In two phases, a microperforation at first and then a macroperforation around four times bigger is introduced into the film by perforated rollers. The resulting microperforations are around 0.05 mm to 0.5 mm in size, while the macroperforations are typically around 0.3 mm to 3 mm in size.

DE 10 2009 044 113 A1 shows a partially perforated microstructured molded object and a method for its production. In this method, a deformable film is partially stretched so that stretch regions of reduced thickness are formed. Next, microstructures are shaped in at least some of the thinned-out stretch regions. Furthermore, pores are created in at least one of the thinned-out stretch regions, while at least some of the undeformed regions remain impermeable.

From EP 0 305 123 A1 a method is known for producing an essentially liquid-impermeable web of material with microbubbles. In this method, a web consisting of a polymer film is transported over a drum. There is a structure on the drum in which the polymer film is shaped by means of a water jet impelled with high pressure, creating microbubbles. In this process, regions remain with practically no thinning out and regions are created with thinning that are shaped deep in the structure. These microbubbles are not pores, simply based on their diameter.

DE 101 34 040 A1 shows a method for production of hollow microfluidic structures made of plastic. In a single process cycle, a thermoplastic synthetic film is thermoshaped into fluidic microstructures by a pressurized gaseous or liquid medium. At the same time, the synthetic film is joined to a rigid or rigid-flexible non-thermoshaped substrate by the action of temperature and pressure.

DE 10 2007 023 286 A1 shows a method for production of a membrane in a frame. In this method, a film is prepared for reshaping and it is reshaped by pressing with a liquid synthetic under pressure into a positive or a negative mold. After the shaping, a solid synthetic is formed, whereupon the composite of unshaped film and solidified melt is removed from the mold.

DE 37 23 404 A1 concerns a liquid-permeable film that is used, for example, as a cover film for absorptive hygiene articles. The film has openings that lie in forms which stick out from the underside of the film. The narrowest point of the forms is recessed relative to the plane of the top side of the film.

In the scientific article by Hebeiss I. et al.: "Novel three-dimensional Boyden chamber system for studying transendothelial transport" in Lab on a Chip, 2012, 12, pages 829-834, the cultivation of cells in microchannel structures is revealed. FIG. 1 of this article shows the production of these microchannel structures, for which a porous film of polycarbonate is formed into a shape. Next, a nonporous film of polycarbonate is placed on the shaped film, while the nonporous film already has recesses so that the shaped regions remain open. A drawback of this solution is that the recesses in the nonporous film have to be positioned with great labor relative to the shaped regions in the porous film so that these match up with each other. This process is not suitable for the mass production of such structures.

SUMMARY OF THE INVENTION

The present invention provides a method for production of a microstructured molded object with limited porous regions within the microstructures, one that can be carried out with low expense and one that is suited for a mass production of such molded objects.

The method according to the invention is used for the production of a microstructured molded object that is particularly suited to the culturing of biological cells. The method involves, first, a step in which a plastically deformable first porous film is prepared, having a plurality of pores. The pores are preferably configured as micropores and are statistically distributed over the film. The pores are fashioned to be continuous from one side to the other of the film, so that they are permeable. Preferably, the pores are distributed statistically equally on the first film. Furthermore, a deformable second film is prepared. In a further step of the method according to the invention, a deformable first sacrificial film is prepared. The first film, the second film and the first sacrificial film are placed in a stack of films. Inside the stack of films, the first film and the second film together lie opposite the first sacrificial film, so that the first sacrificial film does not lie between the first film and the second film. Thus, the first film lies between the second film and the first sacrificial film or the second film lies between the first film and the first sacrificial film. Basically, the first film or the second film can lie directly against the first sacrificial film. In the next step of the method according to the invention, the first sacrificial film is subjected to a pressure, such as a pressing force, to press the stack of films into a mold. The mold has recesses, such that deformed regions in the form of cavities are produced in the first sacrificial film, in the first film and in the second film, and undeformed regions remain. The recesses in the mold determine the shape of the cavities formed in the films. The undeformed regions can be formed by surfaces that are located between the deformed regions. Basically, the undeformed regions can be very small, for example, even edges or points between the deformed regions.

During the pressing of the film stack into the mold, the first film and the second film are joined to each other, so that they form a composite film. The deformed first film and the deformed second film thus together form a single workpiece. Separating the first film from the second film would result in destruction of the workpiece. In the next step of the method according to the invention, the deformed first sacrificial film is removed from the composite film. At this time, the deformed first film and the deformed second film form the double-layer composite film, so that the pores in the deformed first film are closed at one end by the deformed second film.

In another step of the method according to the invention, an etching of at least portions of the deformed regions of the second film occurs, so that at least sections of the deformed regions of the second film are chemically dissolved and thus annihilated. In these sections of the deformed second film, sections in the deformed regions of the first film are opened up, so that the pores in these sections of the first film are again free. As a result, the etched composite film forms a molded object that is impermeable to liquids in its undeformed regions, since the pores of the first film that are located there are closed by the remaining section of the second film. The molded object has cavities in which at least sections are present in which the pores in the deformed first film are opened, so that a liquid exchange can occur with the inner volume of the cavities.

A major benefit of the method according to the invention is that no precise orienting is required between the first film and the second film. A further benefit is that the method is suitable for a roll to roll operation.

During the pressing of the first film and the second film into the mold, the first film and the second film are especially preferably materially bonded together, so that the film composite and the molded object resulting from the method can be exposed to large loads without breaking down into the individual components and thus being destroyed.

The undeformed regions of the first film and the undeformed regions of the second film preferably lie on top of each other in the resulting composite film. In similar manner, the deformed regions of the first film and the deformed regions of the second film preferably lie on top of each other in the resulting composite film. The undeformed regions of the first film and the undeformed regions of the second film may lie precisely on top of each other in the resulting composite film. In similar manner, the deformed regions of the first film and the deformed regions of the second film may lie precisely on top of each other in the resulting composite film.

In some embodiments of the method according to the invention, when stacking the first film, the second film and the first sacrificial film, the second film is arranged between the first film and the sacrificial film. Consequently, after the molding the second film is situated on the inside of the cavities. In alternative embodiments, when stacking the first film, the second film and the first sacrificial film, the first film is arranged between the second film and the sacrificial film. In these embodiments, after the molding the second film is situated on the outside of the cavities.

The pores in the first film during the preparation process have a diameter preferably between 10 nm and 10 µm. In some embodiments, the pores in the first film during the preparation process have a diameter between 100 nm and 5 µm, more preferably between 500 nm and 2 µm.

The density of pores in the first film, i.e., the number of pores per area of the film, is in some embodiments at least $10^5$ pores per cm$^2$ during the preparation process, and more particularly at least $10^6$ pores per cm$^2$. The density of pores in the first film during the preparation process is preferably not more than $10^7$ pores per cm$^2$.

The first film may have a thickness during the preparation process of between 1 µm and 1 mm, and more particularly between 10 µm and 200 µm. In some embodiments of the method of the invention, the thickness of the first film during the preparation process is between 20 µm and 80 µm.

The first film has a width and a length during the preparation process between 1 cm and 50 cm for each, especially preferably between 5 cm and 20 cm.

The first film may consist of a biocompatible material such as a biocompatible plastic. In one embodiment, polycarbonate (PC) is used as the material for the first film. In alternative embodiments, cyclo-olefin copolymer (COC), styrene-acylnitrile (SAN) or polystyrene (PS) is used as the material for the first film.

The second film during the preparation may have a closed surface in its main dimensional plane, so that the pores in the first film can be securely closed. Therefore, the second film during the preparation preferably has no openings, especially no pores that extend from one side of the second film to the other side of the second film.

The second film during the preparation is may be made liquid-tight, especially water-tight, in its main dimensional plane, so that no liquids can get through the pores in the first film and then through the second film.

In some embodiments, the second film is prestructured, especially by microstructures.

In other embodiments, the second film has hollow interior channels, which run essentially parallel to the main dimensional plane of the second film. The hollow channels emerge onto the edges of the second film. As used herein edges refer to the narrow side surfaces of the second film, whose height is determined by the thickness of the second film and that are arranged perpendicular to the main dimensional plane of the second film. Thus, the hollow channels enable a material transport inside the molded object being formed, and this material transport is oriented essentially perpendicular to a material transport through the pores. In particular, the hollow channels and the pores enable the transport of different substances.

The second film may have a thickness during the preparation of between 0.1 µm and 100 µm, and more particularly between 1 µm and 10 µm. In some embodiments of the method according to the invention, the thickness of the second film during the preparation is between 3 µm and 7 µm.

The second film may consist of a plastic.

The first sacrificial film may have a closed surface, so that it has no openings or pores. The first sacrificial film may also be gas-tight, especially air-tight, so that it can be exposed to an air pressure as the pressing force during the shaping, without this pressure acting as a gas pressure on the first and/or second film and damaging them.

The first sacrificial film may have a thickness during the preparation of between 1 µm and 500 µm, and more particularly between 10 µm and 100 µm. In some embodiments of the method according to the invention, the first sacrificial film has a thickness during the preparation between 20 µm and 80 µm.

The first sacrificial film may consist of a plastic, such as a fluorocarbon or silicone. In particularl, the first sacrificial film may consist of perfluorethylene propylene (FEP).

The first film, the second film and the first sacrificial film may be flat prior to the shaping. The flat configuration of the films enables an easy stacking of the films.

The first film, the second film and the first sacrificial film may be arranged one on top of the other congruently during the stacking. For this, the first film, the second film and the first sacrificial film preferably have the same length prior to the shaping. At the same time, the first film, the second film and the first sacrificial film may have the same width prior to the shaping.

The mold may has a plurality of configurations for the formation of cavities. The configurations may be cylindrical, each with a dome-shaped bottom. Alternatively, the configurations can be prismatic or shaped spherical segments.

The configurations in the mold may have a diameter of between 50 μm and 500 μm. Since the configurations determine the dimensions of the cavities being shaped in the first film and in the second film, accordingly the cavities may have an outer diameter of between 50 μm and 500 μm.

The configurations in the mold may have a depth of between 50 μm and 1,000 μm. Since the dimensions of the configurations determine the dimensions of the cavities being formed in the first film and in the second film, the cavities accordingly may have a depth of between 50 μm and 1,000 μm.

The configurations in the mold may be arranged regularly, so that the cavities are also arranged regularly within the main dimensional direction of the molded object being formed. In some embodiments of the method according to the invention, the configurations in the mold are arranged in an orthogonal or hexagonal grid. Alternatively, the configurations can be distributed stochastically in the main dimensional plane of the mold.

The mold may be formed from a metal such as brass.

When subjecting the first sacrificial film to a pressure, an elevated air or gas pressure may be used as the pressing force. Thanks to the elevated air pressure, the film stack is molded into the configurations in the mold.

The undeformed regions of the first film and the undeformed regions of the second film may remain flat in configuration, so that they form a main dimensional plane of the composite film and of the molded object being created. The undeformed regions may lie inside a single plane.

At least the plurality of cavities may be identical in configuration. The cavities also extend from the undeformed regions in relation to its depth. They may also extend in the same direction.

The composite film may be between 1 cm by 1 cm and 50 cm by 50 cm, and more particularly between 5 cm by 5 cm and 20 cm by 20 cm in its main dimensional plane.

The material bonded connection between the first film and the second film may be created directly by the acting force, especially by the pressing force. This may involve a laminating process.

The first film and the second film may be heated directly or indirectly during the pressing to promote the formation of the materially bonded connection. The first film and the second film may be heated at least to a glass transition temperature of the material used for the first film.

In some embodiments of the method according to the invention, adhesive is additionally arranged between the first film and the second film during the stacking of the first film, the second film and the first sacrificial film, which hardens after the pressing and produces the materially bonded connection between the first film and the second film. For this, the first film and/or the second film may have an adhesive layer which hardens after the pressing and results in the materially bonded connection between the first film and the second film. One or both adhesive layers are located between the first film and the second film after the stacking of the first film, the second film and the first sacrificial film.

The materially bonded connection may be formed by a weld connection between the first film and the second film. The connection between the first film and the second film can also be formed by a combination of different forms of connection. For example, the connection can also be formed partly by a force-locked connection.

The etching of at least portions of the deformed regions of the second film may be may be performed by dipping the composite film into an etching bath of an etching liquid. In the most simple case, the composite film is dipped entirely into the etching bath. Since the method according to the invention is also especially suitable for a roll to roll operation, the dipping of the composite film into the etching bath may occur by pulling the composite film through the etching bath. The etching bath may be preferably subjected to ultrasound during the etching in order to prevent bubble formation on the composite film.

In some embodiments of the method according to the invention, the composite film is dipped into the etching bath just enough so that only the deformed regions of the second film are in the etching bath.

In some embodiments of the method according to the invention the composite film is dipped into the etching bath with its main dimensional plane perpendicular to the liquid surface of the etching bath.

The flat undeformed regions of the first film may lie together in the main dimensional plane of the composite film.

Caustic soda may be used for the etching, so that the etching liquid is formed of caustic soda. The caustic soda may have a concentration of sodium hydroxide between 30% and 50%.

The etching liquid, especially the caustic soda, may have a temperature during the etching of between 50° C. and 90° C., and more particularly between 65° C. and 75° C.

The duration of the etching may be between 10 min and 100 min, and more particularly between 30 min and 60 min.

The first film and the second film are stretched into the configurations of the mold during the pressing process, so that the first film is thinned out in its deformed regions and the second film in its deformed regions. This thinning increases with the depth of the cavity, so that the thinning is a maximum at the bottom of the cavity. It is especially relevant for the method of the invention that the second film is thinned out in the deformed regions. It therefore needs no locally selective etching of the second film to fully dissolve only sections in the deformed regions of the second film to open up there the sections of the first film. Thus, the chemical dissolution is confined to the sections in the deformed regions of the second film, without needing a special measure to accomplish this. In the most simple case, the composite film can be dipped entirely into the etching liquid. The undeformed regions of the second film are not thinned out, so that they are only thinned out, but not fully dissolved by the etching. Those sections of the deformed regions of the second film that border on the undeformed regions of the second film are only somewhat thinned out as a result of the deformation, so that these sections of the second film are also preferably not entirely dissolved by the etching, but only somewhat further thinned out.

The thickness of the second film in the deformed region is already reduced after the deformation and before the etching. The thickness of the second film in the deformed regions directly after the deformation but before the etching may be less than 80% of the thickness of the second film before the deformation. In particular, the thickness of the second film in the deformed regions directly after the deformation but before the etching may be less than 50% of the thickness of the second film before the deformation. Also, the thickness of the second film in the deformed regions directly after the deformation but before the etching may be less than 30% of the thickness of the second film before the deformation.

The deformation of the first film in the deformed regions not only produces a thinning out of the first film, but also causes the pores in the first film to take on greater dimensions. The pores in the deformed regions of the first film as a result of the deformation may have an average diameter of more than 150%, and more particularly more than 200%, of the average diameter of the pores before the deformation.

It In the method according to the invention the etching may be adapted to the deformed composite film so that the sections of the second film being dissolved are entirely chemically dissolved and thus annihilated, and that the opened-up sections of the first film with the pores present there remain intact as such, even if a thinning-out of these sections and an enlarging of the pores takes place. Therefore, in some embodiments of the method according to the invention, the material for the etching, the length of the etching, the thickness and the material of the first film, the thickness and the material of the second film, the thickness of the deformed regions of the first film resulting after the deformation and the thickness of the deformed regions of the second film resulting after the deformation are calculated so that the sections in the deformed regions of the second film are entirely chemically dissolved and annihilated and the opened-up sections of the first film remain intact as porous film.

Usually it cannot be entirely prevented that the first film will also be thinned out in the freed-up sections as a result of the etching. Since the freed-up sections of the first film are situated in its deformed regions, these sections are already thinned out by the deformation as compared to the original thickness of the first film any way. The thinned-out sections of the first film after the etching have a thickness that is at least 30%, and more particularly at least 50% of the thickness of these sections of the first film immediately prior to the etching, but after the deformation.

Usually it cannot be entirely prevented that the pores in the freed-up sections of the first film will be enlarged in their dimensions as a result of the etching. These pores are usually already enlarged immediately prior to the etching, because the first film is stretched in the deformed regions, so that the first film is thinned out there, which at the same time leads to an enlarging of the pores. The pores in the freed-up sections of the first film after the etching may have an average diameter that is less than 200% of the average diameter of the pores that existed immediately prior to the etching but after the deformation.

To carry out the method according to the invention it is advantageous to produce a certain etching selectivity between the second film and the first film. By etching selectivity is meant here the ratio of the volume of the second film dissolved during the etching to the volume of the first film dissolved during the etching, selecting each time the identical etching duration, the identical substance for the etching, and also other conditions being identical during the etching. The etching selectivity of the second film in relation to the first film may be at least 1.3; and more particularly, at least 1.5. The etching selectivity can be influenced in particular by the choice of the materials for the second film. The materials used for the second film may be polycarbonate or polyacrylate modified by additives. Such substances are known, for example, by the names Arryphan and Pokalon. These substances have an etching selectivity of 1.3 and 1.7 in relation to polycarbonate.

The sections of the second film that are dissolved during the etching may constitute only a portion of the deformed regions of the second film. The undeformed regions of the second film and portions of the deformed regions bordering on the undeformed regions in the upper half of the cavities remain after the etching. On the contrary, the freed-up sections in the deformed regions of the first film may be situated in the deeper half of the cavities. A complete dissolution of the deformed regions of the second film is, on the one hand, very costly to achieve technologically, and on the other hand it is not desirable for most applications, in order to make sure that no liquid exchange occurs through freed-up pores in the undeformed regions or in their vicinity.

The remaining portions of the deformed regions of the second film bordering on the undeformed regions of the second film have a height that may be between 10% and 90%, and more particularly between 40% and 60% of the depth of the cavities.

The freed-up sections of the first film in the deformed regions of the first film have a height that may be between 10% and 90%, and more particularly between 40% and 60% of the depth of the cavities.

In special embodiments of the method according to the invention the pores in the first film are closed at both ends during the deformation, for which purpose a third film is used. Accordingly, a third film is prepared, the third film being stacked together with the first film, the second film and the first sacrificial film in the film stack. The first film here is arranged between the second film and the third film. The first film, the second film and the third film together lie opposite the first sacrificial film. During the pressing of the film stack via the first sacrificial film into the mold, deformed regions in the form of cavities are also formed in the third film, with undeformed regions remaining Not only are the first film and the second film joined together, but also the first film and the third film may be materially bonded together. The first film, the second film and the third film thus together form the composite film. During the etching, at least portions of the deformed regions of the third film are also etched, so that at least sections in the deformed regions of the third film are chemically dissolved and annihilated. In this way, sections in the deformed regions of the first film are freed up that are at least partly congruent with those sections of the first film that are freed up by the dissolved sections of the second film. Thus, those pores in the first film that are freed up by both the dissolved sections of the second film and the dissolved sections of the third film become permeable and can serve for liquid transport in the resulting molded object.

The third film may also has those features and properties that are described for the second film. The interactions with the first film that are indicated for the second film also hold in equal fashion for the third film.

Further, some embodiments of the method according to the invention result in multilayered cavities, i.e., cavities which have intermediate bottoms in the form of additional films. For this, the method may include the following additional steps. At first, a plastically deformable fourth film is prepared, which may have a similar porosity as the first film and having a plurality of pores. These are, in particular, micropores, which may be statistically distributed, and more particulary equally statistically distributed. Furthermore, a second sacrificial film is prepared. The steps indicated hereafter are done after the removal of the first sacrificial film, but before the etching. The fourth film and the second sacrificial film are stacked on the composite film already formed, comprising the deformed first film and the deformed second film. The fourth film here is situated between the composite film formed at this time and the second sacrificial film. The fourth film here closes off the hollow spaces of the cavities in the composite film. In the next step, the second sacrificial film is subjected to a pressure, especially a pressing force, to press the fourth film into the composite film situated in the mold, whereupon deformed regions are formed in the second sacrificial film and in the fourth film in the form of cavities within the cavities of the composite film and undeformed regions remain. The fourth film may be materially bonded to the composite film at least in its undeformed regions, so that the fourth film also becomes part of the composite film. After this, the second sacrificial film is removed.

One benefit of the fourth film is that it can act as a kind of intermediate bottom in the cavity. For this, the cavities in the deformed fourth film may have a lesser height or depth than the cavities in the deformed first film. The average depth of the cavities in the deformed fourth film may be between 20% and 80% of the average depth of the cavities in the deformed first film.

In order for the deformed fourth film to act as an intermediate bottom, the pores in the fourth film may have a larger diameter than the pores in the first film. Therefore, the pores in the fourth film have an average diameter that may be more than twice that of the average diameter of the pores in the first film.

Since the function of the fourth film is in many respects equal to the function of the first film, the fourth film may also have those features and properties that are described for the first film. In equal fashion, the second sacrificial film also has those features that are described for the first sacrificial film.

Besides the fourth film, additional films can also be introduced as further intermediate bottoms in the molded object being created. Another embodiment of the method according to the invention therefore calls for the use of a fifth film. According to this embodiment, the following steps are to be carried out. A fifth plastically deformable film is prepared, which is porous and has a plurality of pores. The pores may be configured as micropores and they are statistically distributed, and more particularly equally statistically distributed over the fifth film. Furthermore, a third sacrificial film is prepared. The following steps are to be carried out after the removal of the second sacrificial film, but before the etching. The third sacrificial film and the fifth film are stacked on the composite film formed from the deformed first film, the deformed second film and the deformed fourth film. The fifth film is situated here between the third sacrificial film and the composite film. The fifth film here closes off the cavities of the fourth film. In the next step, the third sacrificial film is subjected to a pressure, especially a pressing force, in order to press the fifth film into the composite film located in the mold. In this way, deformed regions are produced in the third sacrificial film and in the fifth film in the form of cavities within the cavities of the composite film, with undeformed regions remaining. The fifth film at least in its undeformed regions may be joined by material bonding to the composite film, so that the fifth film also becomes part of the composite film. After this, the third sacrificial film is removed.

The cavities in the deformed fifth film may have a lesser depth than the cavities in the deformed fourth film. The average depth of the cavities of the deformed fifth film may be between 20% and 80% of the average depth of the cavities in the deformed fourth film. The pores in the fifth film have an average diameter that is twice that of the average diameter of the pores in the fourth film. Furthermore, the fifth film may also have those features which are described for the first film. In the same way, the third sacrificial film may also has those features which are described for the first sacrificial film.

The steps indicated for the fourth film and the fifth film, as well as for the second sacrificial film and the third sacrificial film, can also be carried out for additional films and sacrificial films.

In some embodiments of the method according to the invention, the second film is colored, for which it includes a colored polymer. As a result of this, the second film is more easily identified in the resulting molded object, which facilitates the use of the molded object for the culturing of biological cells. In the same way, the third film may also be colored.

For easier identification within the resulting molded object, a fluorophore may be incorporated in the second film. Likewise, a fluorophore may also be incorporated in the optionally used third film.

Since the molded object made according to the invention is designed for the culturing of biological cells, in some embodiments of the method according to the invention substances are already introduced during the production of the molded object that are related to the subsequent use for culturing of biological cells In particular, the second film may be coated with an active substance for the influencing of biological processes before the second film is placed with the first film in the film stack. The active substance will take effect during the later use of the resulting molded object, especially in that the active substance is given off to the biological material inside the cavities during the use of the molded object. Furthermore, the third film can also be coated with an active substance for the influencing of biological processes before it is placed with the first film and the second film in the film stack.

The active substance may be situated on that side of the second film that is adjacent to the first film during the stacking. Likewise, the active substance may be situated on the side of the optionally used third film that is adjacent to the first film during the stacking.

The second film may be hydrophobic. This means that water present during the later use of the resulting molded object for the culturing of cells and the biological cells containing water can get through to the cavities where the culturing of cells is desired, especially by way of the remaining undeformed regions of the second film. The optionally used third film is also preferably hydrophobic.

In some embodiments of the method according to the invention the second film is coated with a thermoplastic layer, the layer being arranged on the side of the second film that is adjacent to the first film during the stacking During the etching, the layer of thermoplastic may also be chemically dissolved and annihilated in the sections of the second film being dissolved, in order to free up the pores in the sections of the first film being opened up. The thermoplastic layer may also be chemically dissolved and annihilated at least partially in sections of the second film in which the second film remains intact. Thus, hollow spaces are produced between the second film and the first film that extend between the undeformed regions of the first film and the undeformed regions of the second film, and also hollow spaces that extend between the remaining deformed regions of the second film and the deformed regions of the first film. The hollow spaces in the molded object so produced serve in particular for a material transport during the designated use, having a different direction than the material transport through the pores.

In those embodiments of the method according to the invention which call for the use of the third film, the third film also preferably has a thermoplastic layer, the layer being arranged on the side of the third film that is adjacent to the first film during the stacking During the etching, the layer of thermoplastic is also chemically dissolved and annihilated in the sections of the third film being chemically dissolved, so that the pores of the first film located there are opened up. Like the thermoplastic layer on the second film, the thermoplastic layer on the third film is also chemically dissolved and annihilated at least partially in sections of the third film in which the third film remains intact. In this way, hollow spaces are formed between the first film and the third film.

The method according to the invention may be carried out in a roll to roll operation.

Further benefits, features and modifications of the invention will emerge from the following description of various embodiments, making reference to the drawing:

DETAILED DESCRIPTION OF THE DRAWINGS

Figure 1A:
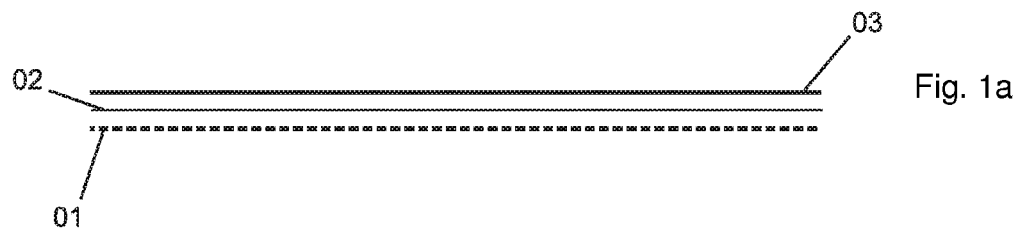
FIGS. 1a-1e show the sequence of a first embodiment of the method according to the invention.

FIGS. 1a-1e show several steps of a first embodiment of the method according to the invention. FIG. 1a shows a step of the method of the invention in which three films are prepared. These are a first film 01, consisting of polycarbonate and having a thickness of 50 µm. The first film 01 is porous and has a plurality of pores, whose diameter on average is 1.3 µm. A second film 02 consists of a modified polycarbonate and has a thickness of only 5 µm. The second film 02 is untreated, so it has no pores, openings, or the like. A first sacrificial film 03 consists of FEP and has a thickness of 50 µm.

Figure 1B:
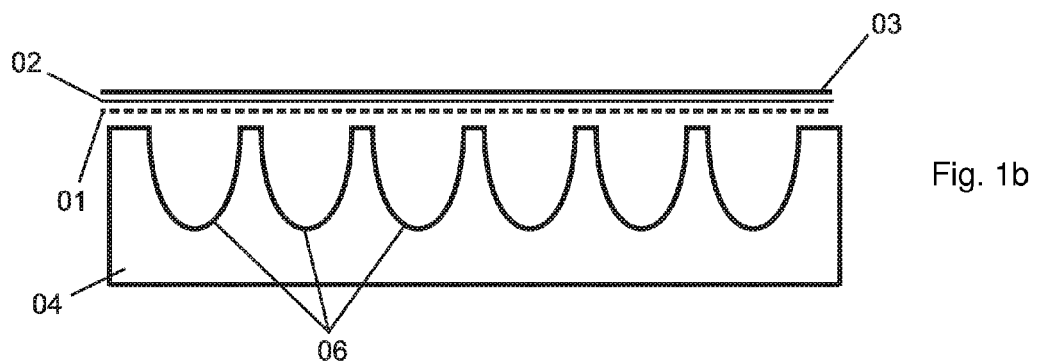

FIG. 1b—shows a second step, in which the three films 01, 02, 03 are stacked one on the other. Here, the second film 02 is arranged on top of the first film 01. The first sacrificial film 03 lies on top of the first film 01 and the second film 02. The film stack formed from the three films 01, 2, 03 is placed on a mold 04, having recesses 06 in the form of cavities. The film stack formed from the three films 01, 02, 03 is pressed into the mold 04 by subjecting the first sacrificial film 03 to a gas pressure.

Figure 1C:
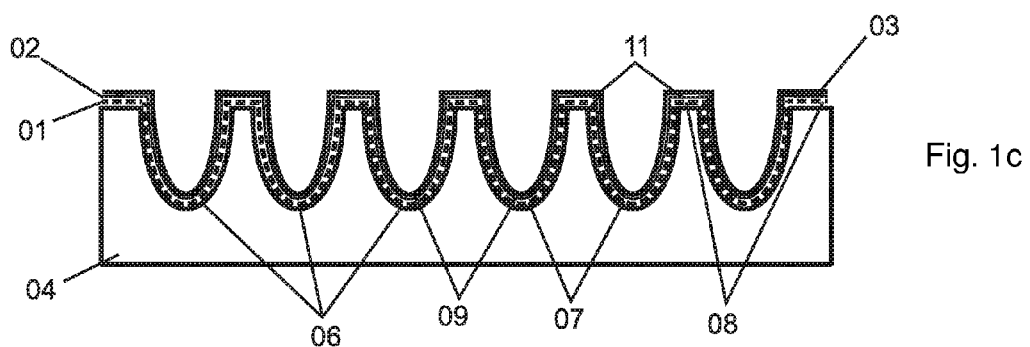

FIG. 1c shows the films 01, 02, 03 after they have been shaped into the mold 04. The first film 01 now has deformed regions 07 that were produced in the recesses 06 of the mold 04. Consequently, the deformed regions 07 of the first film 01 likewise produce cavities. Between the deformed regions 07, the first film 01 continues to have undeformed regions 08. Since the second film 02 was deformed along with the first film 01, the second film 02 also has deformed regions 09 and undeformed regions 11. Thanks to the pressing force exerted, the first film 01 and the second film 02 have been for the most part materially bonded to each other, so that they form a composite film 01, 02. As a result, the pores in the first film 01 are closed at one end.

Figure 1D:
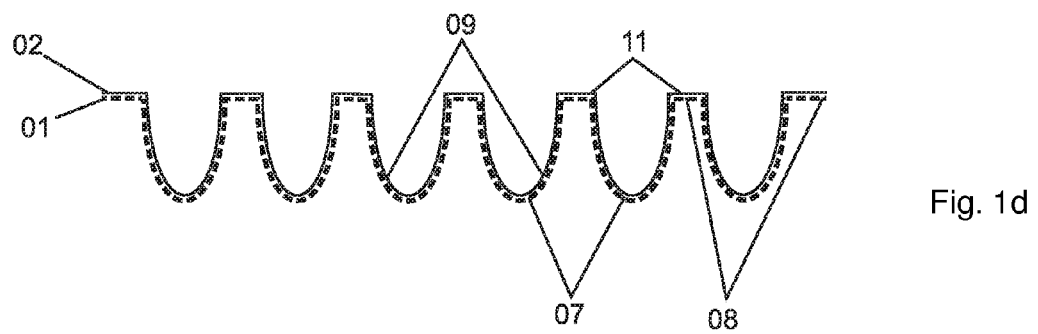

FIG. 1d shows the composite film formed from the two films 01, 02 after it has been removed from the mold 04 and the first sacrificial film 03 is removed. Due to the deformation, the first film 01 no longer has a constant thickness. For the same reason, the second film 02 also no longer has a constant thickness. Instead, the first film 01 is thinned out in its deformed regions 07. Likewise, the second film 02 is thinned out in its deformed regions 09.

The composite film formed from the first film 01 and the second film 02 is now etched in an etching bath (not shown). The etching bath consists of a 40% caustic soda, having a temperature of 70° C. The properties of the etching bath are designed so that sections in the deformed regions 09 of the second film 02 are completely chemically dissolved and thereby annihilated, while the other regions of the second film 02 and the entire first film 01 are somewhat thinned out, but remain intact.

Figure 1E:
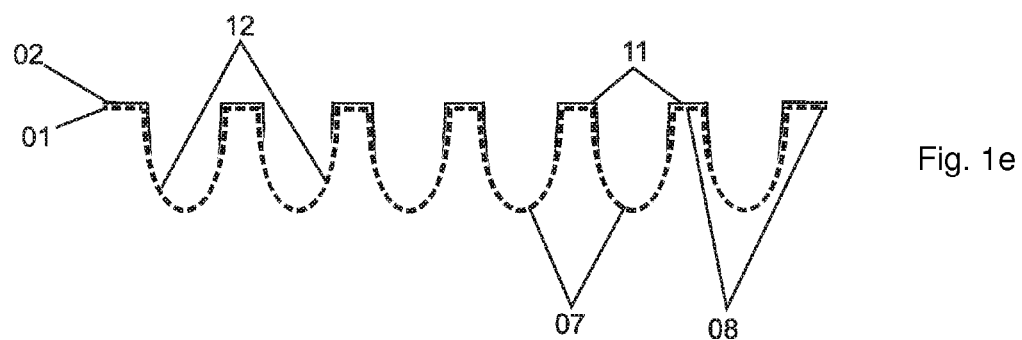
Figure 2A:
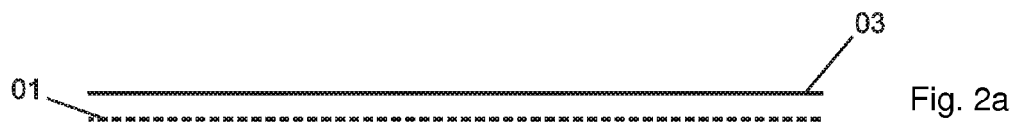
FIGS. 2a-2e show the sequence of a second embodiment of the method according to the invention with an alternative succession of stacking of films.
Figure 2B:
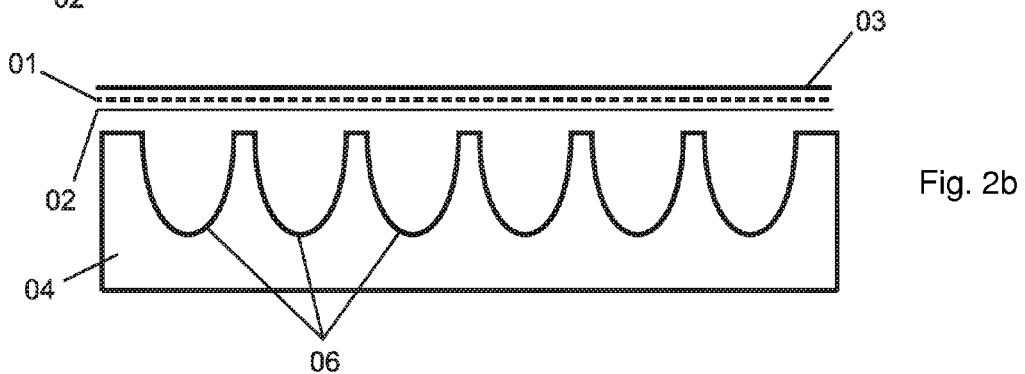
Figure 2C:
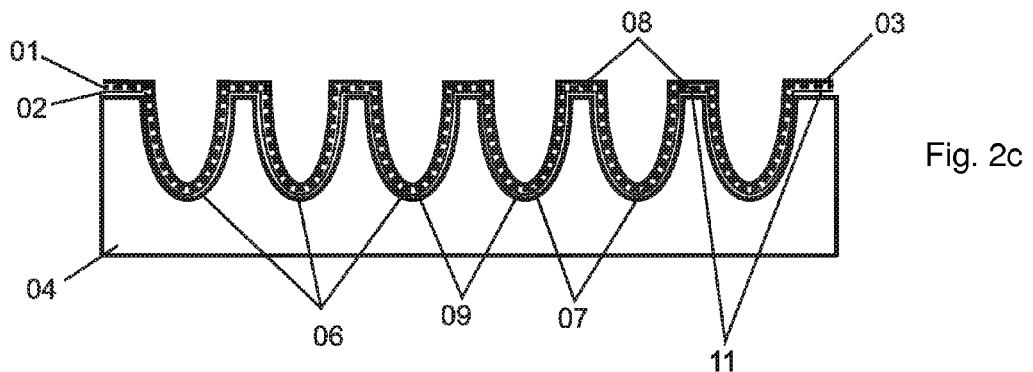
Figure 2D:
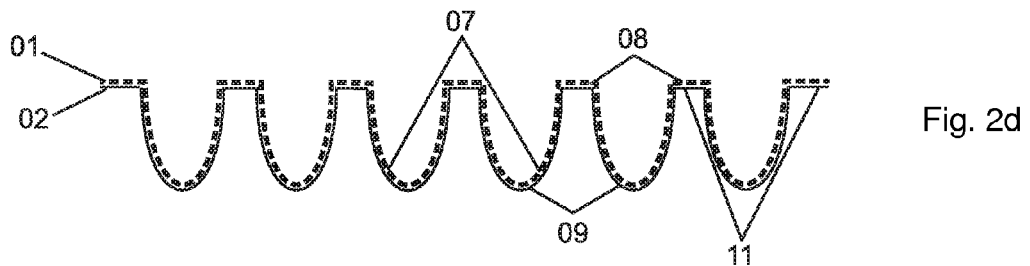
Figure 2E:
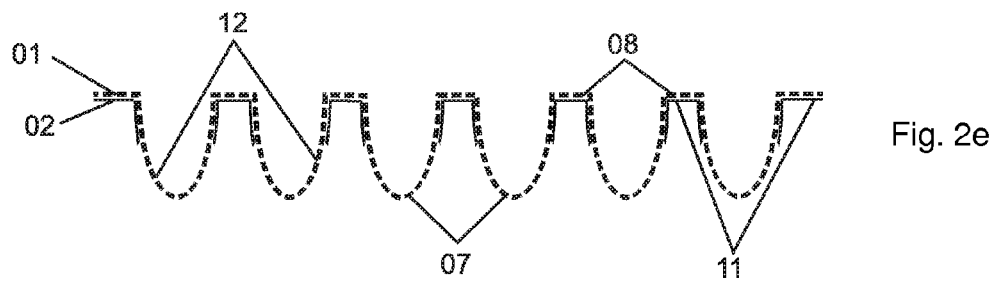

FIG. 1e shows the composite film formed from the two films 01 and 02 after the etching. The deformed regions 09 of the second film 02 are still present only to some extent. As a result, sections 12 in the deformed regions 07 of the first film 01 forming the cavities are no longer covered by the second film 02, so that the pores of the first film 01 located here are once again opened up and thus are permeable. The pores in the sections 12 of the first film 01 have been enlarged by the etching and now have an average diameter of around 3.5 µm.

The composite film formed from the first film 01 and the remaining parts of the second film 02 constitutes the molded object to be made according to the invention.

FIGS. 2a-2e show several steps of a second embodiment of the method according to the invention. The steps shown in FIGS. 2a, 2b, 2c, 2d and 2e are basically equal to the steps shown in FIGS. 1a, 1b, 1c, 1d and 1e. The only difference between the embodiment shown in FIGS. 1a-1e and the embodiment shown in FIGS. 2a-2e are the sequence of stacking of the first film 01 and the second film 02. In the embodiment shown in FIGS. 2a-2e, the first film 01 is arranged between the second film 02 and the first sacrificial film 03. This has the result that, in the molded object produced (shown in FIG. 2-e) the remaining portions of the second film 02 are arranged outside the cavities formed by the deformed regions 07 of the first film 01, while in the molded object resulting from the embodiment of the method of the invention shown in FIGS. 1a-1e the remaining portions of the second film 02 (shown in FIG. 1-e-)) are arranged partially inside the cavities formed by the deformed regions 07 of the first film 01.

Figure 3A:
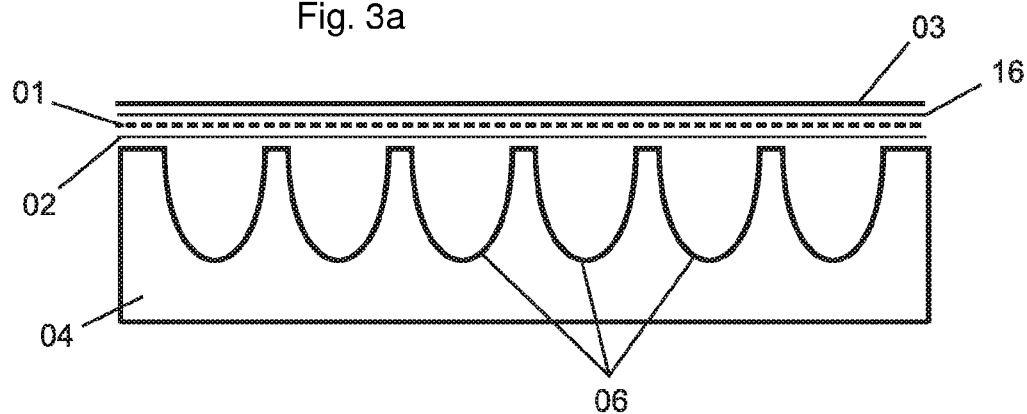
FIGS. 3a-3c show the sequence of a third embodiment of the method according to the invention making use of an additional film.
Figure 3B:
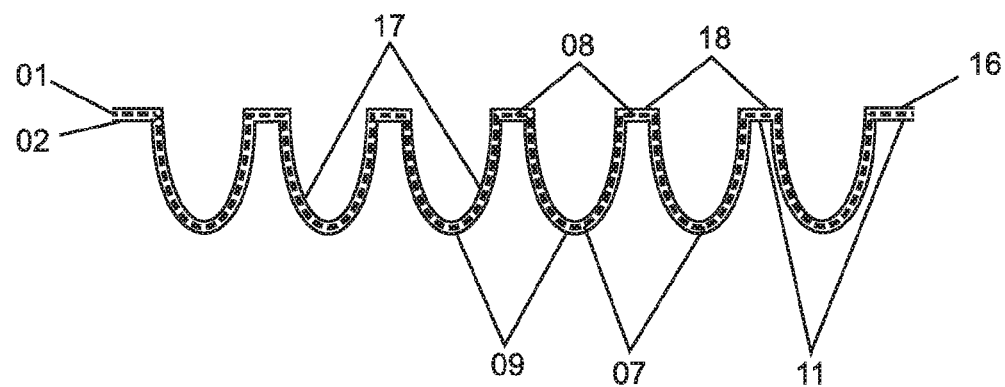
Figure 3C:
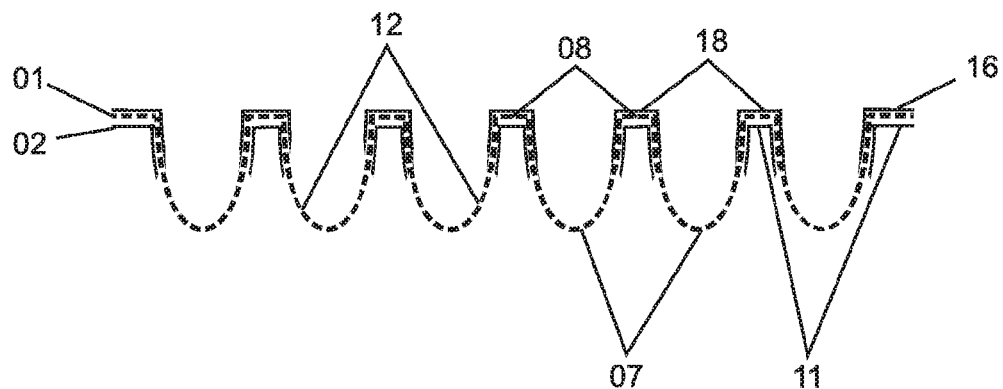

FIGS. 3a-3c show several steps of a third embodiment of the method according to the invention. In this embodiment, just like the embodiments shown in FIGS. 1a-1e and 2a-2e, the first film 01 is joined to the second film 02 so as to close at first all pores in the first film 01. Expanding on the embodiments shown in FIGS. 1a-1e and 2a-2e, the embodiment shown in FIGS. 3a-3c uses a third film 16 to cover the first film 01 on both sides. The third film 16 is identical to the second film 02.

In the cross section shown in FIG. 3a, the first film 01, the second film 02, the third film 16 and the first sacrificial film 03 are arranged one on top of the other, while the first film 01 is arranged between the second film 02 and the third film 16. The first sacrificial film 03 is arranged on top of the first film 01, the second film 02 and the third film 16. The first sacrificial film 03, just as in the embodiment shown in FIGS. 1a-1e and 2a-2e, are subjected to a gas pressure to mold the film stack formed from the first film 01, the second film 02, the third film 16 into the mold 04.

As a result of the molding process, the composite film is produced as shown in FIG. 3-b, being formed from the deformed first film 01, the deformed second film 02 and the deformed third film 16. The deformed third film 16, just like the first film 01 and the second film 02, has deformed regions 17 and undeformed regions 18. The deformed third film 16 is for the most part materially bonded to the first film 01. An etching of the composite film is done, just as in the embodiments shown in FIGS. 1a-1e and 2a-2e.

FIG. 3c shows the molded object resulting from the etching. This molded object is identical to the molded object shown in FIG. 2e in terms of the configuration of the first film 01 and the remaining portions of the second film 02. Just like the sections of the deformed regions 09 of the second film 02, sections have also been chemically dissolved and thus annihilated by the etching process in the deformed regions 17 of the third film 16. In this respect, it is identical to the chemical dissolution of the sections of the second film 02 of the embodiment shown in FIGS. 1a-1e. The undeformed regions 08 of the first film 01 as well as parts of the deformed regions 07 of the first film 01 are covered by the remaining portions of the second film 02 and by the remaining portions of the third film 16, so that the pores located there are closed at both ends, while the pores in the sections 12 in the deformed regions 07 of the first film 01 have been opened.

Figure 4A:
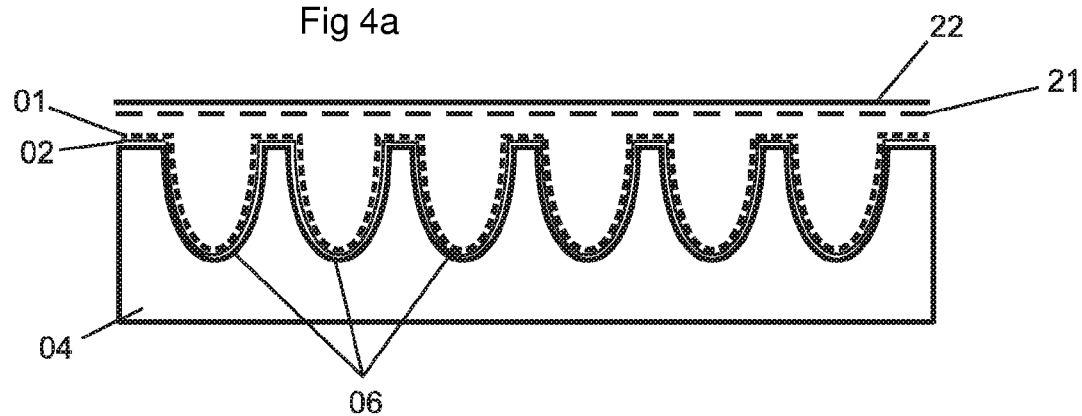
FIGS. 4a-4c show an embodiment of the method according to the invention in which stepped cavities are formed.
Figure 4B:
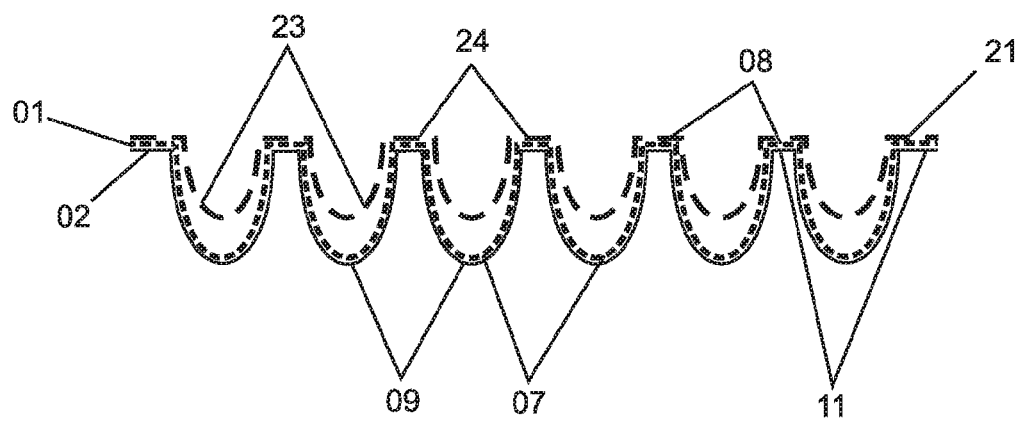
Figure 4C:
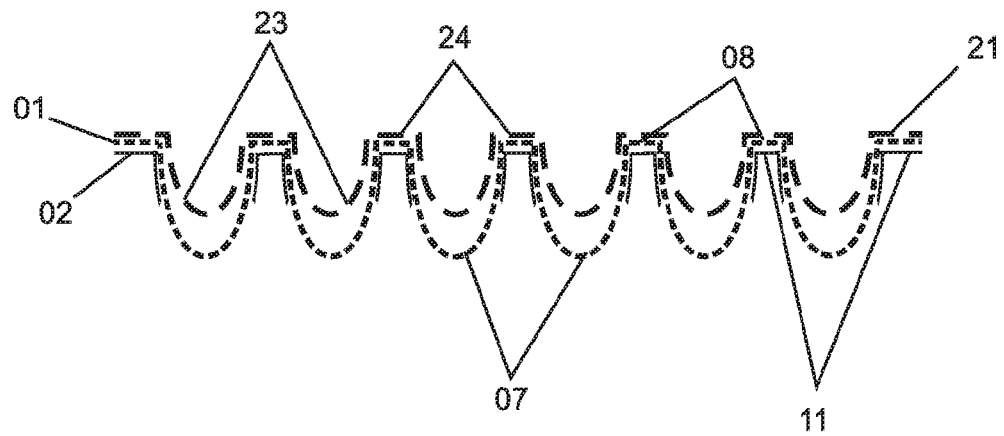

FIGS. 4a-4c show a special embodiment of the method according to the invention. This embodiment has in the beginning the same steps as are shown in FIGS. 2a, 2b, 2c and 2d. Unlike the embodiment shown in FIG. 2a-2e, a fourth film 21 is molded into the composite film formed from the deformed first film 01 and the deformed second film 02 prior to the etching.

FIG. 4a shows a step in which the fourth film 21 is arranged on top of the composite film formed from the deformed first film 01 and the deformed second film 02. The fourth film 21, like the first film 01, consists of polycarbonate and has a thickness of 50 µm. The fourth film 21 is likewise porous, and the pores in the fourth film 21 are around twice the size of the pores in the first film 01. On top of the fourth film 21 is arranged a second sacrificial film 22. The second sacrificial film 22 is subjected to a gas pressure in order to mold the fourth film 21 into the cavities in the deformed regions 07 of the first film 01. In this process, the fourth film 21 is not completely molded into the deformed regions 07 of the first film 01.

FIG. 4b shows the composite film formed from the deformed first film 01 and the deformed second film 02, into which the fourth film 21 has been partly molded. The fourth film 21 now has deformed regions 23 and undeformed regions 24, just like the first film 01 and the second film 02. The deformed regions 23 produce cavities, which have a depth that is only around 50% of the depth of the cavities in the deformed regions 07 of the first film 01. When the fourth film 21 was pressed together with the composite film formed from the deformed first film 01 and the deformed second film 02, the fourth film 21 was also for the most part materially bonded to the first film 01, especially in the undeformed regions 24. This means that now the fourth film 21 is also part of the composite film, which initially included only the deformed first film 01 and the deformed second film 02. After this comes an etching of the composite film in the same way as in the embodiment shown in FIGS. 2a-2e.

FIG. 4c shows the molded object resulting from the etching process. The second film 02 has been completely dissolved in sections of its deformed regions 09, so that the underlying sections 12 of the first film 01 have been opened up. In this regard, this molded object is identical to the molded object shown in FIG. 2e. In addition, the deformed fourth film 21 forms part of the molded object.

What is claimed is:

1. A method for the production of a microstructured molded object, comprising:
 preparing a plastically deformable first film, which has a plurality of pores;
 preparing a deformable second film;
 preparing a deformable first sacrificial film;
 placing the first film, the second film and the first sacrificial film in a stack of films, where the first film and the second film together lie opposite the first sacrificial film;
 subjecting the first sacrificial film to a pressure to press the stack of films into a mold, whereby deformed regions in the form of cavities are produced in the first sacrificial film, in the first film and in the second film, and undeformed regions remain, and whereby the first film and the second film are joined to each other and form a composite film;
 removing the first sacrificial film from the composite film; and
 etching at least portions of the deformed regions of the second film so as to chemically dissolve sections of the deformed regions of the second film, whereby sections in the deformed regions of the first film are opened up; and
 wherein the second film is thinned out during the pressing into the mold in the deformed regions so that the chemical dissolution is confined to the sections in the deformed regions of the second film.

2. The method according to claim 1, wherein the first film and the second film are materially bonded together.

3. The method according to claim 1 wherein the pores in the first film during the preparation have a diameter between 500 nm and 2 µm.

4. The method according to claim 1 wherein the first film has at least $10^5$ pores per cm$^2$.

5. The method according to claim 1 wherein the first film during preparation has a thickness between 20 µm and 80 µm.

6. The method according to claim 1 wherein the mold has configurations for the formation of cavities, and the configurations have a diameter between 50 µm and 500 µm.

7. The method according to claim 1 wherein the second film has a thickness in the deformed regions that is less than 50% of its thickness prior to deformation.

8. The method according to claim 1 wherein a third film is furthermore prepared, wherein:
 the third film is stacked together with the first film, the second film and the first sacrificial film in the film stack, wherein the first film is arranged between the second film and the third film and wherein the first film, the second film and the third film together lie opposite the first sacrificial film;
 during the pressing of the film stack into the mold, deformed regions in the form of cavities are also formed in the third film and undeformed regions remain, and wherein the first film and the third film are also joined together and, together with the second film, form the composite film; and
 wherein at least portions of the deformed regions of the third film are also etched so that sections in the deformed regions of the third film are chemically dissolved, thereby freeing up sections in the deformed regions of the first film.

9. The method according to claim 1 further comprising:
 preparing a plastically deformable fourth film, having a plurality of pores; and
 preparing a second sacrificial film;
 wherein after the removal of the first sacrificial film:

stacking of the second sacrificial film and the fourth film on the composite film;

subjecting the second sacrificial film to a pressing force, to press the fourth film into the composite film situated in the mold, whereupon deformed regions are formed in the second sacrificial film and in the fourth film in the form of cavities within the cavities of the composite film and undeformed regions remain, and whereupon the fourth film is connected to the composite film in its undeformed regions and becomes part of the composite film; and removing the second sacrificial film.

\* \* \* \* \*